(12) United States Patent
Xie et al.

(10) Patent No.: US 11,230,436 B2
(45) Date of Patent: Jan. 25, 2022

(54) SUBSTRATE CONVEYANCE DEVICE

(71) Applicants: BOE TECHNOLOGY GROUP CO., LTD., Beijing (CN); HEFEI XINSHENG OPTOELECTRONICS TECHNOLOGY CO., LTD., Annui (CN)

(72) Inventors: Xuewu Xie, Beijing (CN); Bowen Liu, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

( * ) Notice: Subject to any disclaimer, the term of this patent is extended or adjusted under 35 U.S.C. 154(b) by 537 days.

(21) Appl. No.: 16/306,109

(22) PCT Filed: Jun. 21, 2018

(86) PCT No.: PCT/CN2018/092186
§ 371 (c)(1),
(2) Date: Nov. 30, 2018

(87) PCT Pub. No.: WO2019/052248
PCT Pub. Date: Mar. 21, 2019

(65) Prior Publication Data
US 2021/0229921 A1 Jul. 29, 2021

(30) Foreign Application Priority Data
Sep. 13, 2017 (CN) .......................... 201710821158.9

(51) Int. Cl.
*B65G 13/06* (2006.01)
*B65G 39/02* (2006.01)
*H01L 21/68* (2006.01)

(52) U.S. Cl.
CPC ............. *B65G 13/06* (2013.01); *B65G 39/02* (2013.01); *H01L 21/68* (2013.01)

(58) Field of Classification Search
CPC .... B65G 21/20; B65G 21/2009; B65G 15/64; B65G 54/02; B65G 13/06; B65G 39/02; H01L 21/68
(Continued)

(56) References Cited

U.S. PATENT DOCUMENTS 6,155,406 A * 12/2000 Garbagnati ........ B65G 21/2009
198/805
6,191,507 B1 * 2/2001 Peltier ................... B65G 54/02
310/12.02
(Continued)

FOREIGN PATENT DOCUMENTS

| CN | 1800437 A | 7/2006 |
|----|-----------|--------|
| CN | 1838397 A | 9/2006 |

(Continued)

OTHER PUBLICATIONS

First Office Action dated Sep. 30, 2019, for corresponding CN 201710821158.9 with English translation.
International Search Report dated Sep. 4, 2018 issued in corresponding International Application No. PCT/CN2018/092186.

*Primary Examiner* — James R Bidwell
(74) *Attorney, Agent, or Firm* — Nath, Goldberg & Meyer; Joshua B. Goldberg

(57) ABSTRACT

Disclosed is a substrate conveyance device, comprising: a carrying platform, configured to support a substrate; a conveying mechanism, disposed below the carrying platform and configured to convey the carrying platform; and oppositely disposed guiding mechanisms, disposed on both sides of the carrying platform in a conveying direction, respectively. First magnetic field generators are disposed on both sides of the carrying platform in the conveying direction,
(Continued)

and the guiding mechanism includes second magnetic field generators adjacent to the first magnetic field generators and disposed oppositely to the first magnetic field generators, respectively, such that the first magnetic field generator and the second magnetic field generator which are adjacent to each other have the same polarity. The substrate conveyance device is suitable for conveying various display substrates, especially the substrate having a large size.

10 Claims, 3 Drawing Sheets

(58) Field of Classification Search
USPC .......................................................... 198/805
See application file for complete search history.

(56) References Cited

U.S. PATENT DOCUMENTS

| | | | |
|---|---|---|---|
| 6,601,519 B1 * | 8/2003 | Bindloss, Jr. | ........... B60L 13/08 104/284 |
| 8,020,692 B2 | 9/2011 | Jung et al. | |
| 9,087,865 B2 | 7/2015 | Liu et al. | |
| 2013/0264175 A1 * | 10/2013 | Landrum | ............... B65G 43/02 198/617 |
| 2017/0243735 A1 | 8/2017 | Kaba et al. | |

FOREIGN PATENT DOCUMENTS

| | | |
|---|---|---|
| CN | 101139045 A | 3/2008 |
| CN | 101695970 A | 4/2010 |
| CN | 102055381 A | 5/2011 |
| CN | 102320472 A | 1/2012 |
| CN | 203699393 A | 7/2014 |
| CN | 105416972 A | 3/2016 |
| CN | 105993068 A | 10/2016 |
| CN | 107104074 A | 8/2017 |
| JP | H7-115120 A | 5/1995 |
| JP | 2003-168716 A | 6/2008 |
| JP | 2011199218 A | 10/2011 |
| KR | 101328574 B1 | 11/2013 |
| KR | 101416593 B1 | 7/2014 |
| KR | 20150044107 A | 4/2015 |
| KR | 20150090492 A | 8/2015 |
| WO | 2015056847 A1 | 4/2015 |

* cited by examiner

SUBSTRATE CONVEYANCE DEVICE

This is a National Phase Application filed under 35 U.S.C. 371 as a national stage of PCT/CN2018/092186, filed Jun. 21, 2018, an application claiming the benefit of Chinese Application No. 201710821158.9, filed Sep. 13, 2017, the disclosure of which is incorporated herein by reference.

FIELD OF THE INVENTION

The present disclosure relates to the field of display technologies, and in particular, to a substrate conveyance device.

BACKGROUND

FIG. 1 is a schematic diagram showing a structure of a substrate conveyance device in the related art, and FIG. 2 is a schematic top plan view showing the substrate conveyance device in the related art. As shown in FIGS. 1 and 2, in the production process of the display panel, rollers (or cylinders) are generally used as the power conveying mechanism 1 to convey the substrate 10. Further, in order to convey the substrate 10 in a specific direction, a plurality of guide rollers 2 are usually disposed on both sides in a forward direction of the substrate 10.

However, the substrate 10 being conveyed may come into contact with the conveying mechanism 1 or the guide roller 2 to generate friction. The friction of the substrate 10 with the conveying mechanism 1 or the guide roller 2 may generate particles. In the case of a large-sized display panel, since the large-sized display panel has a large self-weight, a weight of carrying platform becomes larger. In this regard, the frictional force generated by the substrate 10 in relation to the conveying mechanism 1 or the guide roller 2 is also relatively large, thereby generating more particles. These particles are more likely to fall into a region of the substrate 10 close to the guide roller 2 (as indicated by dotted lines in FIG. 2), thereby affecting the quality of the display panel.

SUMMARY

In order to address above problems, the disclosure provides a substrate conveyance device, comprising: a carrying platform, configured to support a substrate; a conveying mechanism, disposed below the carrying platform and configured to convey the carrying platform; and oppositely disposed guiding mechanisms, disposed on both sides of the carrying platform in a conveying direction, respectively, wherein first magnetic field generators are disposed on both sides of the carrying platform in the conveying direction, and the guiding mechanism includes second magnetic field generators adjacent to the first magnetic field generators and disposed oppositely to the first magnetic field generators, respectively, such that the first magnetic field generator and the second magnetic field generator which are adjacent to each other have the same polarity.

Preferably, the guide mechanisms form a guide chamber surrounding the carrying platform, and second magnetic field generators are disposed on inner side walls of the guide chamber.

Preferably, the first magnetic field generator and the second magnetic field generator are located on the same horizontal plane.

Preferably, each of the first magnetic field generator and the second magnetic field generator includes a plurality of magnets spaced apart along the conveying direction.

Preferably, the conveying mechanism comprises: a rotatable conveying roller having an axial direction perpendicular to the conveying direction; a first motor, configured to drive the conveying roller to rotate; and a connecting rod, configured to connect the conveying roller and the first motor.

Preferably, the conveying roller is in direct contact with the carrying platform and supports the carrying platform, and the first motor and the connecting rod are not in contact with the carrying platform; the guide chamber having an inverted U-shaped cross section is mounted on the connecting rod; and the first motor transmits power to the conveying roller through the connecting rod.

Preferably, third magnetic field generators are provided on bottom edges of the carrying platform, and fourth magnetic field generators adjacent to the third magnetic field generators and disposed opposite to the third magnetic field generators are provided on the connecting rods, such that the third magnetic field generator and the fourth magnetic field generator which are adjacent to each other have the same polarity.

Preferably, the guiding chamber having the inverted U-shaped cross section is mounted on the connecting rods, and the fourth magnetic field generator is closer to the conveying roller in relation to the side wall of the guiding chamber.

Preferably, the third magnetic field generator is embedded inside the bottom of the carrying platform, and the conveying roller includes a magnetic rolling shaft serving as the fourth magnetic field generator and a protective sleeve around a surface of the rolling shaft.

Preferably, the protective sleeve is made of rubber; and the protective sleeve has a cylindrical shape concentric with the rolling shaft.

Preferably, a pitch of the magnets of the first magnetic field generator is smaller than that of the magnets of the second magnetic field generator.

Figure 1:
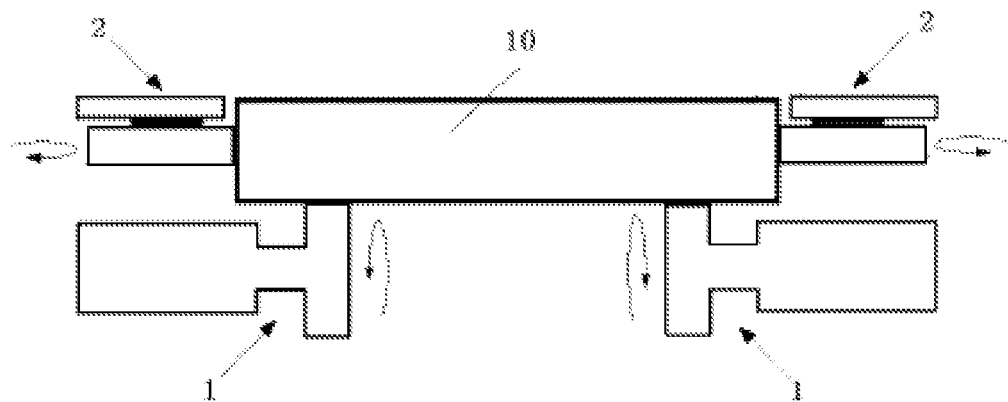
FIG. 1 is a schematic diagram showing a structure of a substrate conveyance device in the related art.
Figure 2:
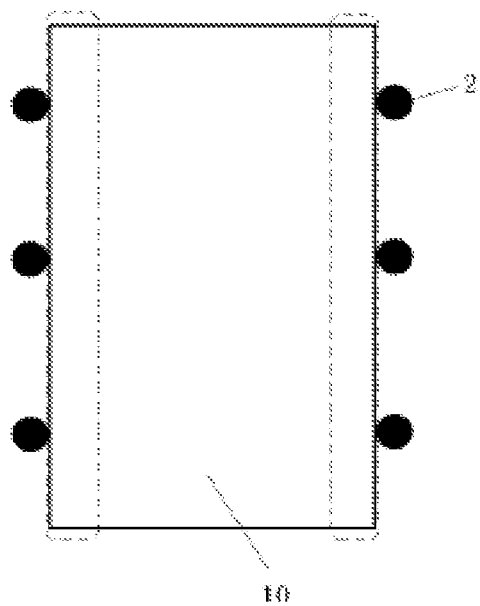
FIG. 2 is a schematic top plan view showing the substrate conveyance device in the related art.

In the drawings, reference numerals are: 10, a substrate; 1, a conveying mechanism; 11, a conveying roller; 12, a first motor; 13, a connecting rod; 14, a fourth magnetic field generator; 15, a rolling shaft; 16, a protective sleeve; 2, a guiding roller; 3, a carrying platform; 31, a first magnetic field generator; 33, a third magnetic field generator; 4, a guiding mechanism; 41, a guiding chamber; and 42, a second magnetic field generator.

DETAILED DESCRIPTION OF THE EMBODIMENTS

In order to enable those skilled in the art to better understand the technical solutions of the present disclosure, the present disclosure will be further described in detail below in conjunction with the accompanying drawings and specific embodiments.

Figure 3:
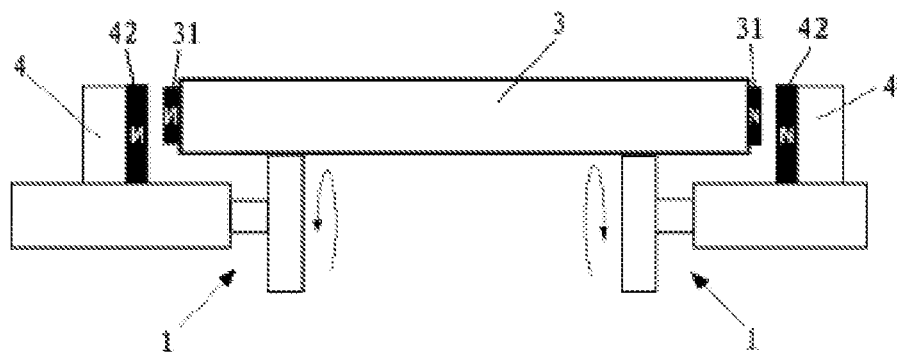
FIG. 3 is a schematic diagram showing a structure of a substrate conveyance device according to an embodiment of the present disclosure.

FIG. 3 is a schematic diagram showing a structure of a substrate conveyance device according to an embodiment of the present disclosure. As shown in FIG. 3, the substrate conveyance device includes a carrying platform 3, a conveying mechanism 1, and oppositely disposed guiding mechanisms 4. The carrying platform 3 is configured to support a substrate; the conveying mechanism 1 is disposed below the carrying platform 3 and configured to convey the carrying platform 3; the guiding mechanisms 4 are disposed on both sides of the carrying platform 3 in a conveying direction, respectively. First magnetic field generators 31 are disposed on both sides of the carrying platform 3 in the conveying direction, and the guiding mechanism 4 includes second magnetic field generators 42 adjacent to the first magnetic field generators 31 and disposed oppositely to the first magnetic field generators 31, respectively, such that the first magnetic field generator 31 and the second magnetic field generator 42 which are adjacent to each other have the same polarity.

Herein, the term "same polarity" means that the first magnetic field generator 31 and the second magnetic field generator 42 are N poles or S poles. In the exemplary embodiment shown in FIG. 3, the first magnetic field generator 31 and the second magnetic field generator 42 are both N poles.

According to this embodiment, the first magnetic field generators 31 are disposed on both sides of the carrying platform 3 in the conveying direction, and the guiding mechanism 4 includes the second magnetic field generators 42 adjacent to the first magnetic field generators 31 and opposite to the first magnetic field generators 31, respectively, such that the first magnetic field generator 31 and the second magnetic field generator 42 which are adjacent to each other have the same polarity. Since a mutually exclusive force can be generated between the first magnetic field generator 31 and the second magnetic field generator 42 which are adjacent to each other and have the same polarity, the carrying platform 3 can be restricted from approaching the guiding mechanism 4. In this way, it is possible to avoid the generation of particles due to the contact of the carrying platform 3 with the guiding mechanism 4. Therefore, the substrate on the carrying platform 3 cannot be contaminated.

Figure 4:
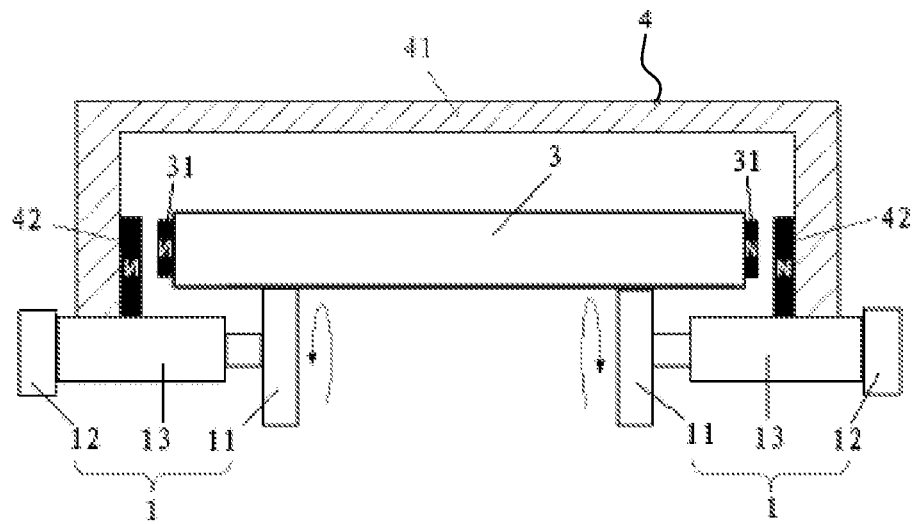
FIG. 4 is a schematic diagram showing a structure of a substrate conveyance device according to an embodiment of the present disclosure.

FIG. 4 is a schematic diagram showing a structure of a substrate conveyance device according to an embodiment of the present disclosure. As shown in FIG. 4, the substrate conveyance device includes a carrying platform 3, a conveying mechanism 1, and oppositely disposed guiding mechanisms 4. The carrying platform 3 is configured to support a substrate; the conveying mechanism 1 is disposed below the carrying platform 3 and configured to convey the carrying platform 3; the guiding mechanisms 4 are disposed on both sides of the carrying platform 3 in a conveying direction, respectively. First magnetic field generators 31 are disposed on both sides of the carrying platform 3 in the conveying direction. In this embodiment, the guide mechanisms 4 form a guide chamber 41 surrounding the carrying platform 3, and second magnetic field generators 42 are disposed on inner side walls of the guide chamber 41. The second magnetic field generators 42 are adjacent to the first magnetic field generator 31 and disposed oppositely to the first magnetic field generators 31, respectively, such that the adjacent first magnetic field generator 31 and the second magnetic field generators 42 which are adjacent to each other have the same polarity.

In this embodiment, as shown in FIG. 4, the guiding chamber 41 has a cross section of inverted U-shape such that the guiding chamber can surround both sides of the carrying platform 3 in the conveying direction. In this way, it is possible to prevent foreign contaminants from approaching the substrate during the conveying of the substrate, thereby further ensuring the quality of the display panel.

As an optional implementation in the embodiment, the first magnetic field generator 31 and the second magnetic field generator 42 are located on the same horizontal plane.

According to the embodiment of the present disclosure, the carrying platform 3 and the substrate on the carrying platform 3 are carried by the conveying mechanism 1 underneath the carrying platform 3. It should be noted that the magnetic force (i.e., the repulsive force) generated between the first magnetic field generator 31 and the second magnetic field generator 42 is designed to ensure that the carrying platform 3 can not deviate from the conveying direction of the conveying mechanism 1. In general, the magnetic force (i.e., the repulsive force) can be calculated according to sizes of the carrying platform 3 and the substrate, or can be set empirically.

Figure 5:
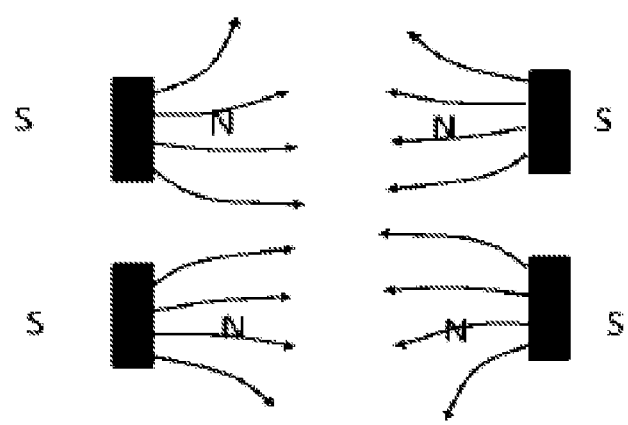
FIG. 5 is a schematic diagram showing a magnetic field generated by a first magnetic field generator and a second magnetic field generator according to an embodiment of the present disclosure.

As an optional implementation in the embodiment, a successive long magnet may be disposed on an inner side wall of the guiding chamber 41 as the second magnetic field generator 42. In this way, a continuous magnetic force (i.e., repulsive force) can be generated between the first magnetic field generator 31 and the second magnetic field generator 42 to ensure smooth conveying of the substrate. It can be understood that, as shown in FIG. 5, a direction of magnetic line of the magnetic field generated by the first magnetic field generator 31 (or the second magnetic field generator 42) is curved. Therefore, as a preferred implementation of this embodiment, each of the first magnetic field generator 31 and the second magnetic field generator 42 may include a plurality of magnets spaced apart along the conveying direction. Preferably, a pitch of the magnets of the first magnetic field generator 31 is smaller than that of the magnets of the second magnetic field generator 42.

As an optional implementation in the embodiment, as shown in FIG. 4, the conveying mechanism 1 includes a rotatable conveying roller 11, a first motor 12, and a connecting rod 13, wherein an axial direction of the rotatable conveying roller 11 is perpendicular to the conveying direction; the first motor 12 is configured to drive the conveying roller 11 to rotate; and the connecting rod 13 is configured to connect the conveying roller 11 and the first motor 12.

Further, as shown in FIG. 4, the conveying roller 11 is in direct contact with the carrying platform 3 and supports the carrying platform 3, and neither the first motor 12 nor the connecting rod 13 is in contact with the carrying platform 3. The guide chamber 41 having an inverted U-shaped cross section is mounted on the connecting rod 13. The first motor 12 transmits power to the conveying roller 11 through the connecting rod 13.

Figure 6:
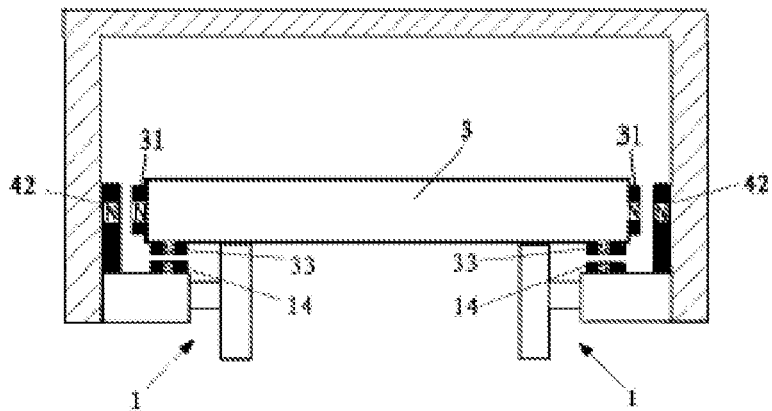
FIG. 6 is a schematic diagram showing a structure of a substrate conveyance device according to an embodiment of the present disclosure.

FIG. 6 is a schematic diagram showing a structure of a substrate conveyance device according to an embodiment of the present disclosure. In this embodiment, as shown in FIG.

6, third magnetic field generators 33 are provided on bottom edges of the carrying platform 3, and fourth magnetic field generators 14 adjacent to the third magnetic field generators 33, respectively, and disposed opposite to the third magnetic field generators 33 are provided on the connecting rods 13, such that the third magnetic field generator 33 and the fourth magnetic field generator 14 which are adjacent to each other have the same polarity. In this way, the friction between the conveying roller 11 and the carrying platform 3 can be reduced.

Preferably, the guiding chamber 41 having the inverted U-shaped cross section is mounted on the connecting rods 13, and the fourth magnetic field generators 14 are closer to the conveying rollers 11 in relation to the side walls of the guiding chamber.

In this embodiment, as shown in FIG. 6, the second magnetic field generator 42, the first magnetic field generator 31, the fourth magnetic field generator 14, and the conveying roller 11 are sequentially disposed from the outside to the inside in the guiding chamber 41. The side wall of the guiding chamber 41, the second magnetic field generator 42, and the fourth magnetic field generator 14 are located on the connecting rod 13. The first magnetic field generator 31 is located at both ends of the carrying platform 3 opposite to the second magnetic field generator 42. The third magnetic field generator 33 is located at the bottom edge of the carrying platform 3 opposite to the fourth magnetic field generator 14.

In an exemplary embodiment, the guiding chamber 41 may be a vacuum chamber in a substrate evaporation-deposition process. In this case, the second magnetic field generator 42 is located on an inner wall of the vacuum evaporation-deposition chamber. When the guiding chamber 41 is applied to the evaporation-deposition process, the connecting rod 13 is also located in the evaporation-deposition chamber. Further, an evaporation-deposition device, a vapor source and a vapor material (not shown in FIG. 6), for example, may be provided in the guiding chamber 41 serving as an evaporation-deposition chamber.

Figure 7:
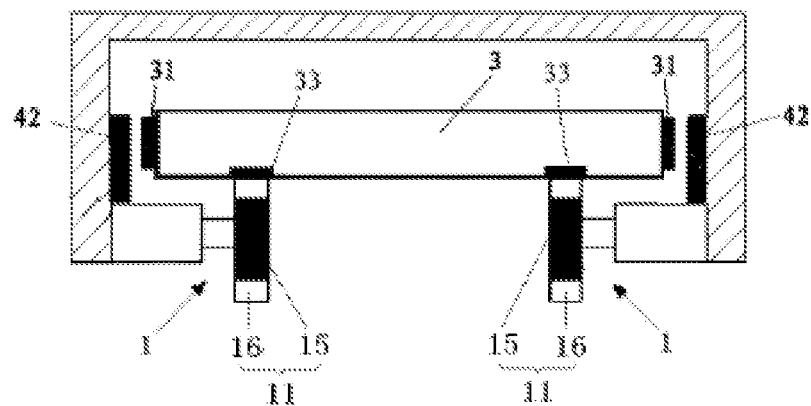
FIG. 7 is a schematic diagram showing a structure of a substrate conveyance device according to an embodiment of the present disclosure.
Figure 8:
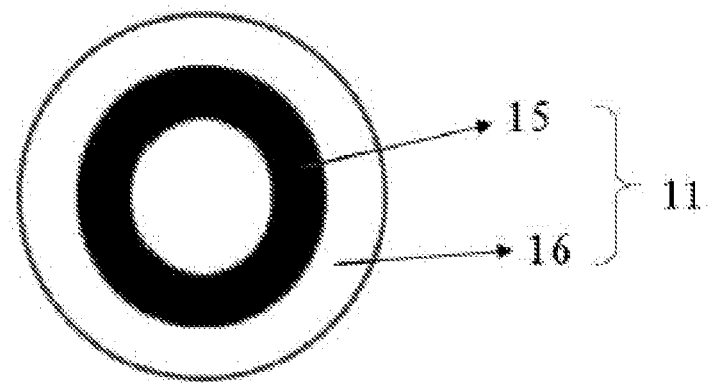
FIG. 8 is a cross-sectional view of a conveying roller according to an embodiment of the present disclosure.

FIG. 7 is a schematic diagram showing a structure of a substrate conveyance device according to an embodiment of the present disclosure; and FIG. 8 is a cross-sectional view of a conveying roller according to the embodiment of the present disclosure. In an embodiment of the present disclosure, as shown in FIGS. 7 and 8, the third magnetic field generator 33 is embedded inside the bottom of the carrying platform 3, and the conveying roller 11 includes a magnetic rolling shaft 15 serving as the fourth magnetic field generator 14 and a protective sleeve 16 around a surface of the rolling shaft 15.

In this embodiment, as shown in FIG. 7, the magnetic rolling shaft 15 serves as the fourth magnetic field generator 14 and is disposed inside the conveying roller 11. The magnetic rolling shaft 15 usually can be made of a magnet. More specifically, in this embodiment, the magnetic rolling shaft 15 may be a radially magnetized magnet such that an outer circumference of the rolling shaft 15 has the same polarity as that of the third magnetic field generator 33.

As a preferred implementation in the embodiment, the protective sleeve 16 is made of rubber; and the protective sleeve 16 has a cylindrical shape concentric with the rolling shaft 15.

FIG. 8 shows a cross-sectional view of the conveying roller 11 according to this embodiment. As shown in FIG. 8, an inner core of the conveying roller 11 is formed as a hollow magnetic rolling shaft 15, and the protective sleeve 16 surrounds the outer circumference of the rolling shaft 15, such that the rolling shaft 15 and the protective sleeve 16 have the same axial center. Thus, it is possible to prevent the conveying roller 11 from damaging the carrying platform 3.

It should be noted that the size, thickness, and the like of each structure shown in the drawings are schematic. In a specific practice, the size and proportion of the structure can be changed according to actual needs.

There is provided a display device in an embodiment of the present disclosure, which employs the above substrate conveyance device in the preparation process. Examples of the display device may include a liquid crystal display panel, an electronic paper, an OLED panel, a mobile phone, a tablet computer, a television, a monitor, a notebook computer, a digital photo frame, a navigator, and any product or component having a display function.

It is to be understood that the above embodiments are merely exemplary embodiments employed to explain the principles of the present disclosure, but the present disclosure is not limited thereto. Various modifications and improvements can be made by those skilled in the art without departing from the spirit and scope of the disclosure, and such modifications and improvements are also considered to be within the scope of the disclosure.

The invention claimed is:

1. A substrate conveyance device, comprising:
    a carrying platform, configured to support a substrate;
    a conveying mechanism, disposed below the carrying platform and configured to convey the carrying platform; and
    oppositely disposed guiding mechanisms, disposed on both sides of the carrying platform in a conveying direction, respectively,
    wherein first magnetic field generators are disposed on both sides of the carrying platform in the conveying direction, and the guiding mechanism includes second magnetic field generators adjacent to the first magnetic field generators and disposed oppositely to the first magnetic field generators, respectively, such that the first magnetic field generator and the second magnetic field generator which are adjacent to each other have the same polarity, and
    wherein each of the first magnetic field generator and the second magnetic field generator includes a plurality of magnets spaced apart along the conveying direction, and a pitch of the magnets of the first magnetic field generator is smaller than that of the magnets of the second magnetic field generator.

2. The substrate conveyance device according to claim 1, wherein the guide mechanisms form a guide chamber surrounding the carrying platform, and second magnetic field generators are disposed on inner side walls of the guide chamber.

3. The substrate conveyance device according to claim 1, wherein the first magnetic field generator and the second magnetic field generator are located on the same horizontal plane.

4. The substrate conveyance device according to claim 2, wherein the conveying mechanism comprises:
    a rotatable conveying roller having an axial direction perpendicular to the conveying direction;
    a first motor, configured to drive the conveying roller to rotate; and
    a connecting rod, configured to connect the conveying roller and the first motor.

5. The substrate conveyance device according to claim 4, wherein
the conveying roller is in direct contact with the carrying platform and supports the carrying platform, and the first motor and the connecting rod are not in contact with the carrying platform;
the guide chamber having an inverted U-shaped cross section is mounted on the connecting rod; and
the first motor transmits power to the conveying roller through the connecting rod.

6. The substrate conveyance device according to claim 4, wherein third magnetic field generators are provided on bottom edges of the carrying platform, and fourth magnetic field generators adjacent to the third magnetic field generators and disposed opposite to the third magnetic field generators are provided on the connecting rods, such that the third magnetic field generator and the fourth magnetic field generator which are adjacent to each other have the same polarity.

7. The substrate conveyance device according to claim 6, wherein
the guiding chamber having the inverted U-shaped cross section is mounted on the connecting rods, and
the fourth magnetic field generator is closer to the conveying roller in relation to the side wall of the guiding chamber.

8. The substrate conveyance device according to claim 6, wherein the third magnetic field generator is embedded inside the bottom of the carrying platform, and the conveying roller includes a magnetic rolling shaft serving as the fourth magnetic field generator and a protective sleeve around a surface of the rolling shaft.

9. The substrate conveyance device according to claim 8, wherein the protective sleeve is made of rubber; and the protective sleeve has a cylindrical shape concentric with the rolling shaft.

10. A display device, wherein the display device is manufactured by the substrate conveyance device according to claim 1.

* * * * *